United States Patent [19]
Song

[11] Patent Number: 5,895,258
[45] Date of Patent: Apr. 20, 1999

[54] SEMICONDUCTOR DEVICE FABRICATION METHOD

[75] Inventor: Du-Heon Song, Kyungki-Do, Rep. of Korea

[73] Assignee: LG Semicon Co., Ltd., Choongcheongbuk-do, Rep. of Korea

[21] Appl. No.: 08/774,801

[22] Filed: Dec. 30, 1996

[30] Foreign Application Priority Data

Dec. 30, 1995 [KR] Rep. of Korea ............... 95-68656

[51] Int. Cl.$^6$ .................................................. H01L 21/76
[52] U.S. Cl. ........................... 438/444; 438/228; 438/451
[58] Field of Search ................................. 438/228, 445, 438/451, FOR 229, FOR 168, FOR 217, 444

[56] References Cited

PUBLICATIONS

IEEE Electron Device Letters, vol. 14, No. 8, Aug. 1991, pp. 412–414, "The Current–Carrying Corner Inherent . . . ".
IEEE Transactions on Electron Devices, vol. Ed.–32, No. 2, Feb. 1985, pp. 441–445, "Analysis of an Anomalous . . . ".

*Primary Examiner*—George R. Fourson

[57] ABSTRACT

A semiconductor fabrication method for forming an insulation film and a first anti-oxidation film sequentially on a substrate which is sectioned into each of a peri region and a cell region. An active pattern is formed in the cell region and a first field ion-implanted region in a first conductive well of the cell region. Side wall spacers are formed on each side wall of the active pattern in the cell region. An active pattern is formed in the peri region by selectively etching the first anti-oxidation film and the insulation film so as to expose a certain surface portion of the peri region substrate therethrough. A first field ion-implanting region is formed in a first conductive well of the peri region by ion-implanting highly concentrated first conductive impurities through the exposed substrate and a second field ion-implanted region in a second conductive well of the peri region. Lastly, a field oxide layer created using a field oxidation process after removing the first anti-oxidation film, the insulation film and the side wall spacers. The method beings by forming a semiconductor device which eliminates double hump phenomenon, decreases leakage current and lowers stand-by current to improve the operating properties of the device.

7 Claims, 6 Drawing Sheets

FIG.2A-1
FIG.2A-2
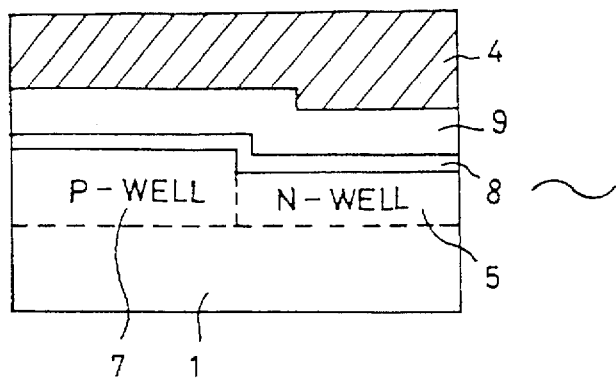
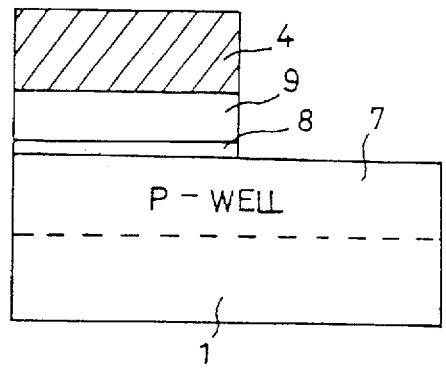
FIG.2B-1
FIG.2B-2
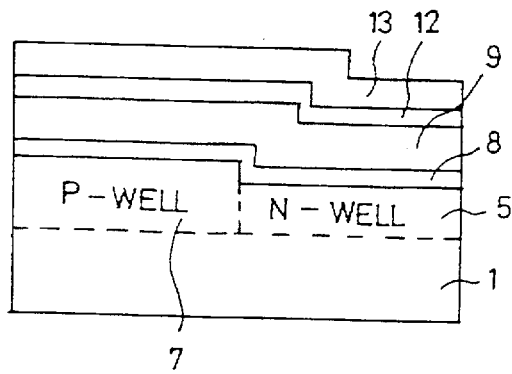
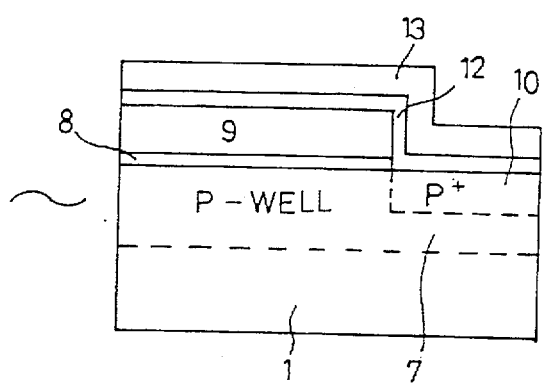
FIG.2C-1
FIG.2C-2
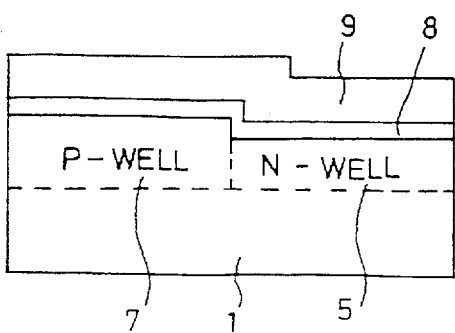
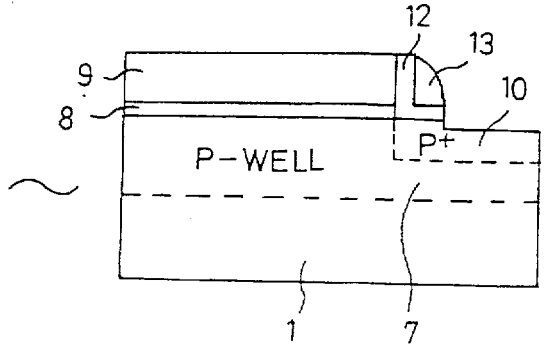

FIG.2D-1
FIG.2D-2
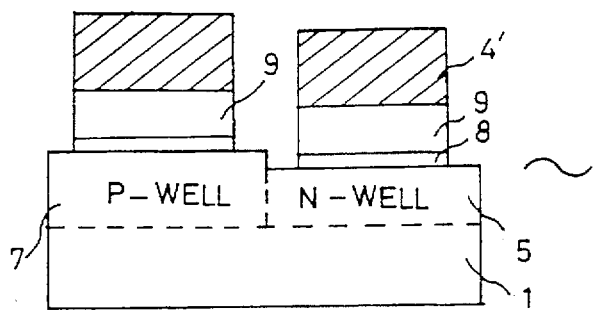
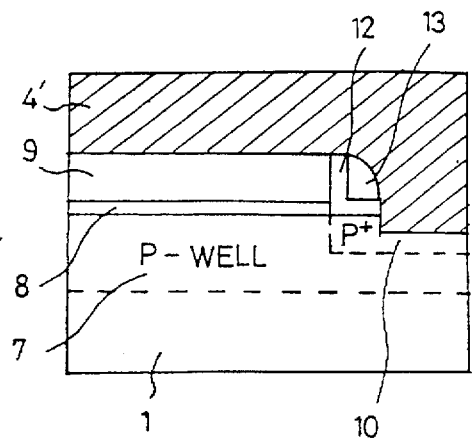
FIG.2E-1
FIG.2E-2
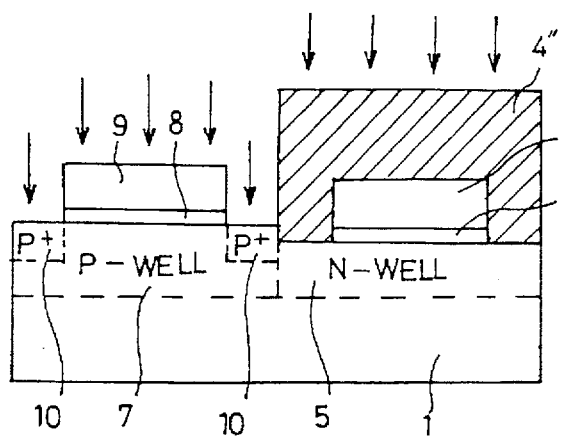
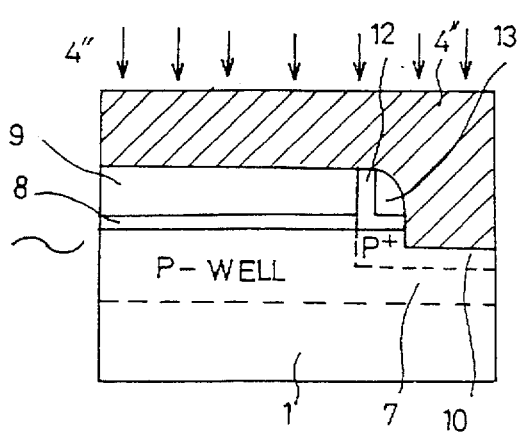
FIG.2F-1
FIG.2F-2
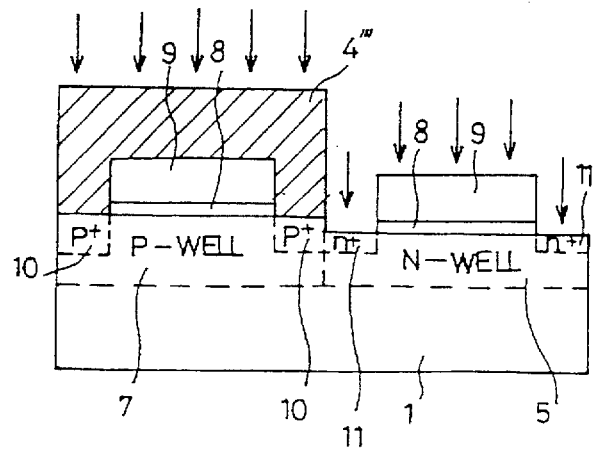
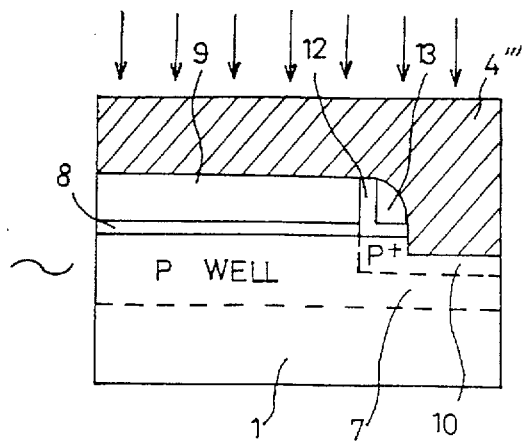

SEMICONDUCTOR DEVICE FABRICATION METHOD

BACKGROUND OF THE INVENTION

1. Field of the Invention

The present invention relates to a semiconductor device, and more particularly to a semiconductor device fabrication method for realizing an isolation structure in a memory chip, by means of applying a memory cell region formation to an advanced local oxidation of silicon (LOCOS) process, and a peri region to a general step thereof.

2. Description of Conventional Art

A conventional semiconductor device fabrication method for fabricating a 64 MB dynamic random access memory (DRAM) using an advanced LOCOS technique is illustrated in FIGS. 1A-1 through 1I-2. There will be described the fabrication steps in accordance with the accompanying drawings wherein FIGS. 1A-1, 1B-1, . . . 1I-1 as shown on the left side thereof denote a peri region isolation structure and FIGS. 1A-2, 1B-2, . . . 1I-2 as shown on the right side illustrate a cell region isolation structure respectively.

As shown in FIGS. 1A-1 and 1A-2, the first step is to grow a base oxidation 8 as an insulation film on a substrate 1 which is sectioned into a peri region and a cell region. The peri region defines a substrate portion composed of each of a first conductive well (hereinafter, "P-well") and a second conductive well (hereinafter, "N-well"), and the cell region denotes a substrate portion composed of a P-well.

As shown in FIGS. 1B-1 and 1B-2, the second step is to deposit a first nitride film 9 as a first anti-oxidation film on the base oxidation film 8, and to form a pair of photoresist patterns 4 on active pattern regions of the first nitride film 9 by a lithographic process.

As shown in FIGS. 1C-1 and 1C-2, the third step is to etch the first nitride film 9 and the base oxidation film 8 using the photoresist 4 as a mask, to form active patterns composed of the oxidation film 8 and the nitride film 9 on the peri and cell regions of the substrate 1. Afterwards, the remaining photoresist 4 is removed.

As shown in FIGS. 1D-1 and 1D-2, the fourth step is, after removing the photoresist 4 includes the following. In the peri region another photoresist pattern 4' is formed that entirely covers the exposed active pattern formed on the second conductive well 5. Then, highly concentrated first conductive impurities (such as p+impurities) are implanted into the substrate 1 of the peri and cell regions using the photoresist 4' as a mask to form N-field ion-implanted regions 10 (such as p+regions) for serving as first field ion-implanted regions in the first conductive wells 7 of each of the peri and cell regions. The photoresist 4' is then removed.

As shown in FIGS. 1E-1 and 1E-2, the fifth step begins forming another photoresist 4" to entirely cover the exposed active pattern formed on the first conductive well 5. Highly concentrated second conductive impurities (such as n+impurities) are then implanted into the substrate 1 using the photoresist 4" as a mask to form P-field ion-implanted regions 11 (such as n+regions) for serving as first field ion-implanted regions in the second conductive well 5 of the peri region. The photoresist 4" is thereafter removed.

As shown in FIGS. 1F-1 and 1F-2, the sixth step is to perform a LOCOS annealing on the substrate 1 having the active patterns thereon, to deposit a second nitrate thin film 12 as a second anti-oxidation film on the annealed surface, and to form thereon a HLD (high temperature and low pressure dielectric) insulation film 13.

As shown in FIGS. 1G-1 and 1G-2, the seventh step is to form side wall spacers on each side wall of the active patterns and on selected surfaces of the substrate 1. The side wall spacers are formed by dry etching portions of the HLD insulation film 13 and a portion of the second nitride film 12. A silicon dry etching is performed with the side wall spacers and the active patterns acting as masks so that the exposed substrate 1 is etched to a defined depth of up to 500 Å. Beginning with FIG. 1G-1, the first conductive well 7 and the second conductive well 5 will be shown without a step therebetween for convenience' sake.

As shown in FIGS. 1H-1 and 1H-2, the eighth step includes performing a field oxidation in the recesses formed during the seventh step so as to form a field oxidation film 14. The HLD insulation film 13 is removed from the side wall spacers. A field diffusion is then performed that results in an N-field 10' being formed in the P-well 7 in each of the peri and cell regions and a P-field 11' being formed in the N-well 5.

As shown in FIGS. 1I-1 and 1I-2, the ninth step is to remove the first nitrate film 9, the second nitrate film 12, and the base oxidation film 8, thus to complete the semiconductor device isolation structure fabrication.

Consequently, the conventional advanced LOCOS technology is focused on isolating the active regions and the device isolation regions from each other using each of the field oxidation film 14, N-field 10' and P-field 11'. Therefore, when a semiconductor device is manufactured using the advanced LOCOS technique, the field oxidation film 14 tends to be formed steeply at its bird's beak portion so that the active regions are less likely to be intruded into by the field oxidation film 14 and become decreased in size. As a result, the conventional technique remains advantageous for forming memory device regions being densely patterned such as a cell region.

However, the LOCOS technique can induce a double hump phenomenon in which a parasitic transistor initially turns on in active edge regions which will be in contact with gates during the device fabrication. The "double hump phenomenon" is illustrated in IEEE Electron Device Letters, Vol. 14, No. 8, August 1991, pp. 412–414 in the article entitled "The Current-Carrying Corner Inherent to Trench Isolation" and in IEEE Transactions on Electron Devices, Vol. Ed.-32, No. 2, February 1985, pp. 441–445 in the article entitled "Analysis of an Anomalous Subthreshold Current in a Fully Recessed Oxide MOSFET Using a Three-Dimensional Device Simulator." Therefore, the LOCOS technique has a disadvantage in that, because of the current leakage and increased stand-by current occurring in a peri region where memory operating circuits are congregated, the memory device operating characteristics can be adversely affected.

SUMMARY OF THE INVENTION

Accordingly, it is an object of the present invention to provide a semiconductor device fabrication method for preventing a double hump phenomenon which can occur during its fabrication, by applying an advanced LOCOS technique to a cell region wherein a strict design rule is employed, and to a peri region, by applying a general LOCOS technique wherein device patterning will be less densely populated to reduce leakage current problems.

To achieve the above-described object, the semiconductor device fabrication method in accordance with the present invention includes forming an insulation film and a first anti-oxidation film sequentially on a substrate which is sectioned by each of a peri region and a cell region; the peri region is composed of a first and a second conductive wells and the cell region is composed of a first conductive well, forming an active pattern in the cell region by selectively etching the first oxidation film and the insulation film so as to expose a certain surface portion of the cell region substrate therethrough, forming a first field ion-implanting region in the first conductive well of the cell region by ion-implanting highly concentrated first conductive impurities through the exposed substrate, forming side wall spacers on each side wall of the active pattern in the cell region, forming an active pattern in the peri region by selectively etching the first anti-oxidation film and the insulation film so as to expose a certain surface portion of the peri region substrate therethrough, forming a first field ion-implanting region in the first conductive well of the peri region by ion-implanting highly concentrated first conductive impurities through the exposed substrate, forming a second field ion-implanting region in the second conductive well of the peri region by ion-implanting highly concentrated second conductive impurities through the exposed substrate, forming a field oxide layer using a field oxidation process, and removing the first anti-oxidation film, the insulation film and the side well spacers. By taking the above steps, a semiconductor device operating property can be significantly improved.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only and thus are not limitative of the present invention and wherein:

FIGS. 2A-1 through 2H-2 are sectional views of a semiconductor device formed by a semiconductor device fabrication method in accordance with the present invention, wherein FIGS. 1A-1, 1B-1, . . . 1H-1 as shown on the left side thereof denote a peri region isolation structure and FIGS. 1A-2, 1B-2, . . . 1H-2 as shown on the right side indicate a cell region isolation structure, respectively.

DETAILED DESCRIPTION OF THE PRESENT INVENTION

FIGS. 2A-1 through 2H-2 show a semiconductor device fabrication method in accordance with the present invention, which fabrication method will now be described with reference to the attached drawings.

Figures 1, 1A:
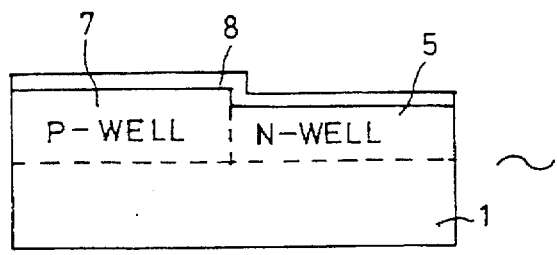
FIGS. 1A-1 through 1I-2 are sectional views of a semiconductor device being formed by a conventional semiconductor device fabrication method, wherein FIGS. 1A-1, 1B-1, . . . 1I-1 as shown on the left side thereof denote a peri region isolation structure and FIGS. 1A-2, 1B-2, . . . 1I-2 as shown on the right side indicate a cell region isolation structure, respectively.
Figures 1, 1A, 2:
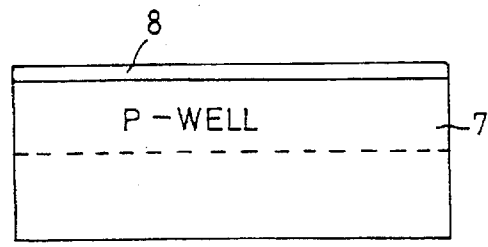
Figures 1, 1B:
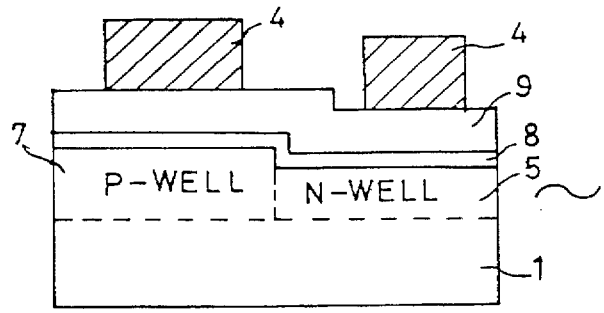
Figures 1, 1B, 2:
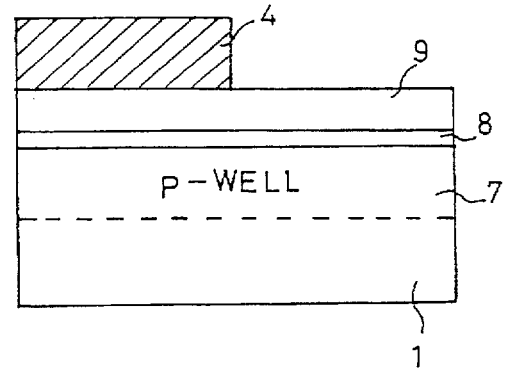
Figures 1, 1C:
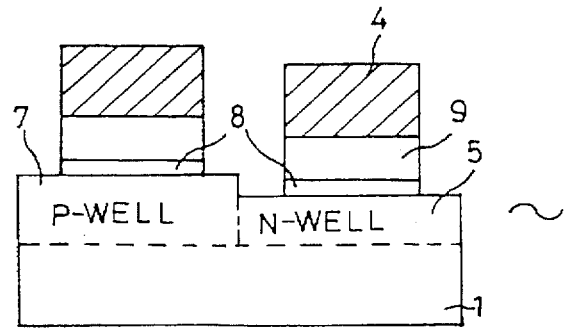
Figures 1, 1C, 2:
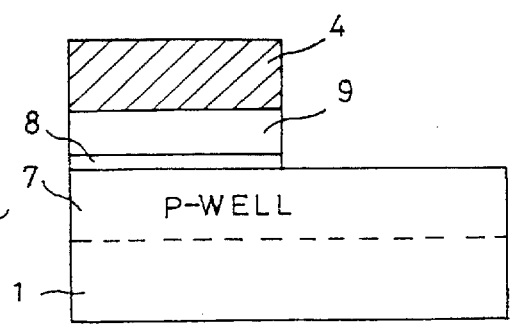
Figures 1, 1D:
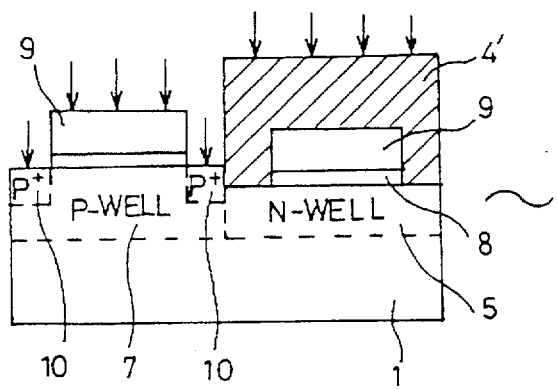
Figures 1, 1D, 2:
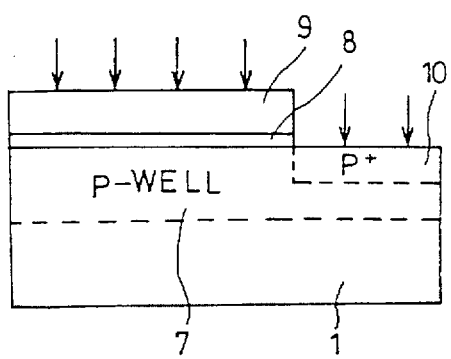
Figures 1, 1E:
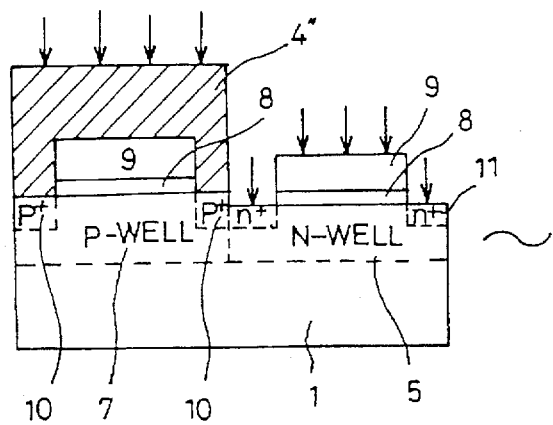
Figures 1, 1E, 2:
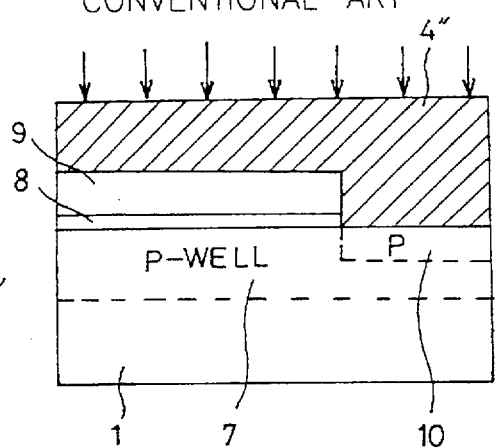
Figures 1, 1F:
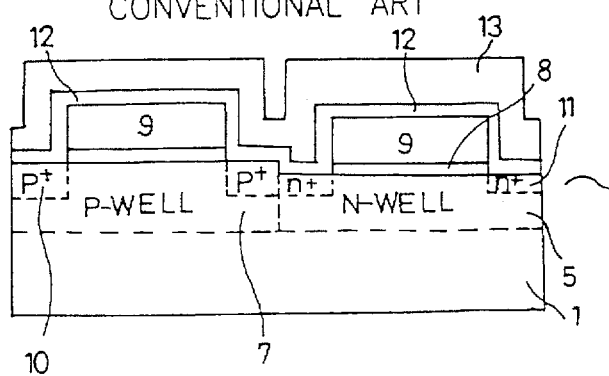
Figures 1, 1F, 2:
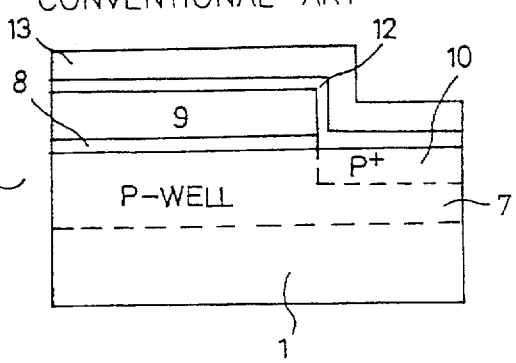
Figures 1, 1G:
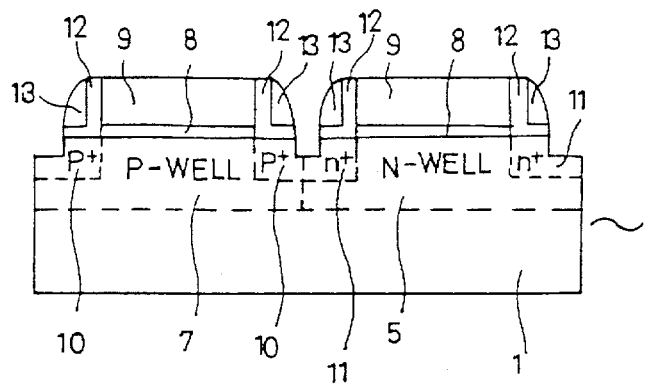
Figures 1, 1G, 2:
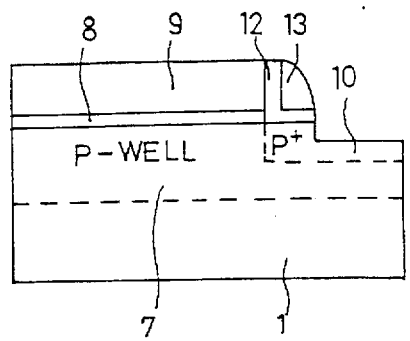
Figures 1, 1H:
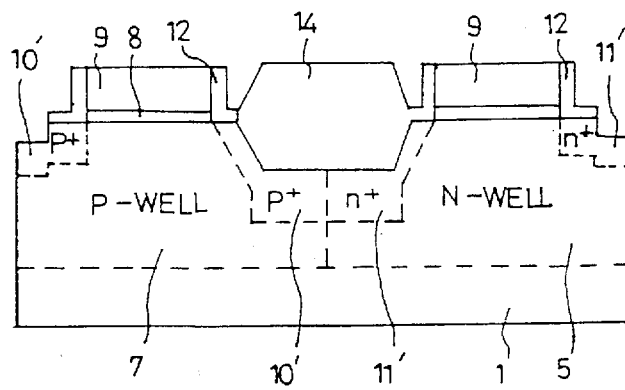
Figures 1, 1H, 2:
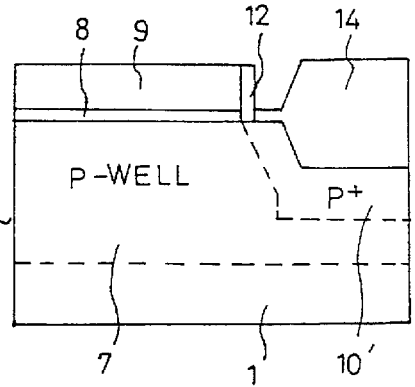
Figures 1, 1I:
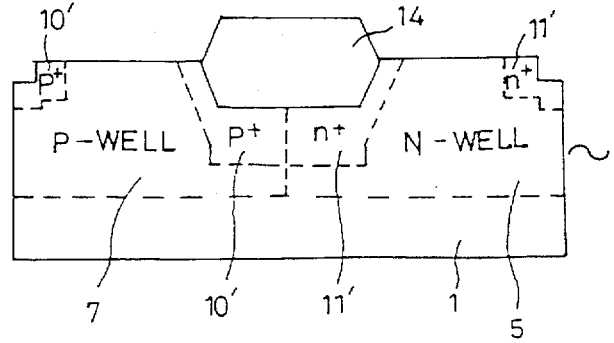
Figures 1, 1I, 2:
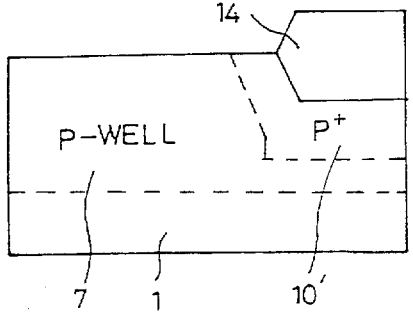

As shown in FIGS. 2A-1 and 2A-2, the process begins by growing a base oxidation film 8 as an insulation film on a substrate 1 which is sectioned into a peri region and a cell region. The peri region denotes a substrate portion composed of each of a P-well 7 and an N-well 5, and the cell region denotes a substrate portion composed of a P-well. A first nitrate film 9 is deposited thereon as a first anti-oxidation film. A photoresist film 4 is then formed on the first nitride film 9. The photoresist film 4 is selectively etched into a pattern so as to expose a portion of the first nitride film 9 in the cell region. The first nitrate film 9 and the base oxidation film 8 are etched using the photoresist film pattern 4 as a mask so as to form a certain surface portion of the substrate 1. As a result, an active pattern composed of the base oxidation film 8 and the first nitride film 9 is formed in the cell region on the substrate 1.

As shown in FIGS. 2B-1 and 2B-2, a second stage begins with removing the photoresist film 4. Highly concentrated first conductive impurities (such as p+impurities) are ion-implanted into the exposed substrate 1 so as to form an N-field ion-implanting region 10 in the P-well 7 as a first field ion-implanting region. A second nitrate film 12 is deposited as a second anti-oxidation film on the first nitrate film 9 and the surface-exposed substrate 1. A HLD insulation film 13 is thereafter deposited on the second nitrate film 12.

As shown in FIGS. 2C-1 and 2C-2, a third stage includes removing selected portions of the HLD insulation film 13 and the second nitride film 12 using a dry etching so as to form side wall spacers on the side wall of the active pattern in the cell region. Each spacer being composed of a portion of the HLD insulation film 13 and a portion of the second nitride film 12. The cell region silicon substrate is dry-etched to a certain depth using the side wall spacers as a mask. At this time, if desired, the cell region silicon etching process may be omitted.

As shown in FIGS. 2D-1 and 2D-2, a fourth stage includes forming a photoresist film 4' on the first nitrate film 9, the side wall spacers and the dry-etched substrate surface. The photoresist film 4' is removed by a selective etching to form a pattern thereof so that a certain portion of the substrate surface is exposed therethrough. The first nitride film 9 and the base oxidation film 8 are etched using the photoresist film pattern 4' as a mask so as to form an active pattern on the peri region of the substrate 1. Thereafter, the photoresist film 4' is removed.

As shown in FIGS. 2E-1 and 2E-2, a fifth stage begins by forming a photoresist film 4" so as to entirely cover the exposed active pattern formed on the P-wells 7. A selective etching is performed on the photoresist film 4" to form a pattern thereof so as to expose the active pattern formed on the surface of each of the P-wells 7 and the N-well 5. Highly concentrated first conductive impurities (such as p+impurities) are ion-implanted into the substrate 1 using the photoresist film pattern 4" as a mask, thereby forming an N-field ion-implanted region 10 such as a p+region for serving as a first field ion-implanted region in the P-well 7 of each of the peri and cell regions. The photoresist film 4" is then removed.

As shown in FIGS. 2F-1 and 2F-2, a sixth stage includes first forming a photoresist 4''' on the substrate 1 (having the active patterns thereon) and on the side wall spacers. A selective etching of the photoresist film 4''' is performed to form a pattern thereof so as to expose the active pattern formed on the N-well 5 and the P-well 7 in the peri region. "Highly concentrated second conductive impurities (such as n+impurities) are ion-implanted into the N-well so as to form P-field ion-implanted regions." The photoresist film 4''' is then removed.

Figures 1, 2G:
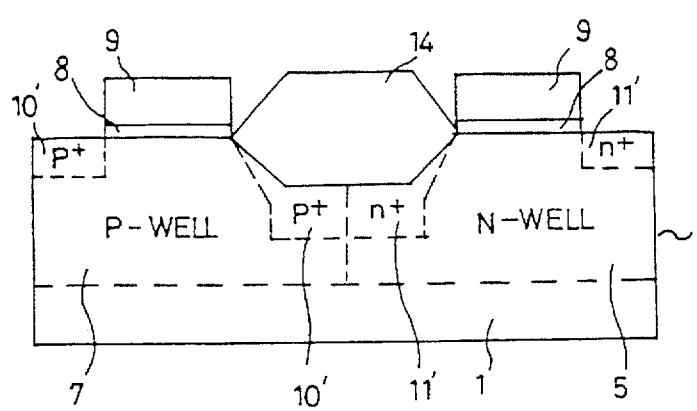
Figures 2, 2G:
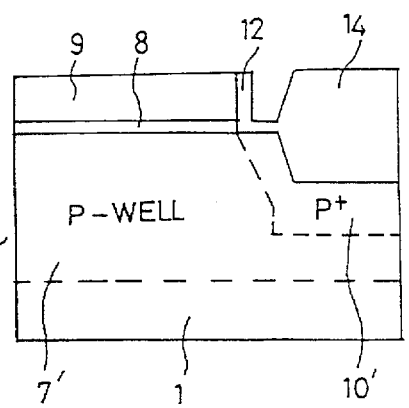

As shown in FIGS. 2G-1 and 2G-2, a seventh stage includes forming a field oxide layer 14 in areas extending between the P-well 7 and N-well 5 of the peri region and in the P-well 7 of the cell region by performing a field oxidation. Afterwards, the HLD insulation film 13 is removed. A field diffusion is then performed so as to form N-field 10' in the P-well 7 and a P-field 11' in the N-well 5.

Figures 1, 2H:
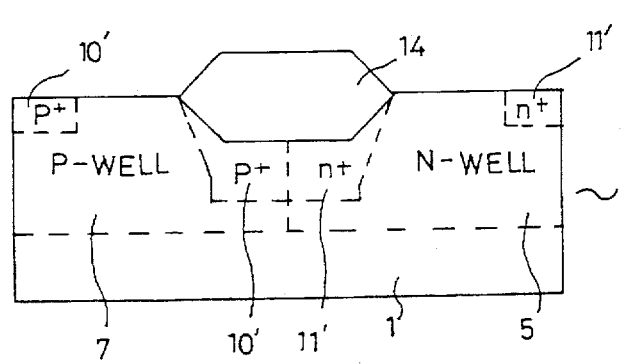
Figures 2, 2H:
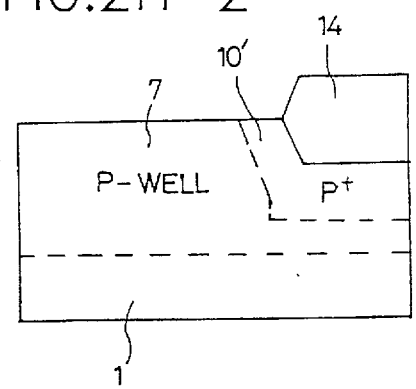

As shown in FIGS. 2H-1 and 2H-2, an eighth stage begins by removing the first nitride film 9, the second nitrate film 12 and the base oxidation film 8. The isolation structure fabrication of a semiconductor device is then completed in accordance with the present invention.

As described above, the present invention enables the elimination of a double hump phenomenon occurring in an active pattern edge region, thus preventing current leakage and stand-by current increase which can occur in the peri region, by providing a semiconductor device isolation structure in a single memory chip wherein an advanced LOCOS process is applied to densely populated cell regions in a memory device and a general LOCOS process is applied to sparsely populated peri regions in the memory device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device fabrication method, comprising:

forming an insulation film and a first anti-oxidation film sequentially on a substrate which is sectioned into each of a peri region and a cell region, wherein the peri region is composed of first and second conductive type wells and the cell region is composed of the first conductive type well;

forming an active pattern in the cell region by selectively etching the first oxidation film and the insulation film so as to expose a portion of the surface of the cell region substrate therethrough;

forming a first field ion-implanted region in the first conductive well of the cell region by ion-implanting first conductive impurities into the exposed substrate;

forming a side wall spacer on each side wall of the active pattern in the cell region;

forming an active pattern in the peri region by selectively etching the first anti-oxidation film and the insulation film so as to expose a portion of the surface of the peri region substrate therethrough;

forming a first field ion-implanted region in the first conductive well of the peri region by ion-implanting the first conductive impurities into the exposed substrate;

forming a second field ion-implanted region in the second conductive well of the peri region by ion-implanting second conductive impurities into the exposed substrate;

removing the side wall spacers;

forming a field oxide layer by field oxidation in an area of the substrate extending between the first and second conductive wells of the peri region and in the first conductive well of the cell region; and removing the first anti-oxidation film and the insulation film.

2. The fabrication method of claim 1, wherein said step of forming side wall spacers includes forming a second anti-oxidation film and, thereafter, forming a second insulation film on said first anti-oxidation film and said exposed substrate of the peri and cell regions.

3. The fabrication method of claim 1, further comprising dry-etching selected areas of said substrate to a depth that is defined prior to initiating dry-etching, the dry-etching being performed after forming said side wall spacers on each side wall of the active pattern on the cell region.

4. The fabrication method of claim 1, wherein the step of forming the first field ion-implanted region in the first conductive well comprises:

forming a photoresist film to entirely cover the active pattern formed on the peri and cell regions of the substrate;

etching selectively the photoresist film to form a pattern so that the first conductive well surface of the peri region and the active pattern formed thereon are exposed therethrough;

ion-implanting the first conductive impurities into the substrate using the photoresist as a mask; and removing the photoresist film pattern.

5. The fabrication method of claim 1, wherein the step of forming the second field ion-implanted region in the second conductive well of the peri region comprises:

forming a photoresist film to entirely cover the active pattern on the cell and peri regions of the substrate;

etching selectively the photoresist film to form a pattern so as to expose the active pattern formed on the second conductive well surface of the peri region therethrough;

ion-implanting the second conductive impurities into the substrate using the photoresist film pattern as a mask, and removing the photoresist film pattern therefrom.

6. The fabrication method of claim 1, further comprising the step of performing diffusion after forming the field oxide layer by a fluid oxidation film.

7. The fabrication method of claim 2, wherein the first and second anti-oxidation films are formed of a nitride film.

* * * * *